(12) United States Patent
Edwards et al.

(10) Patent No.: US 8,778,788 B2
(45) Date of Patent: Jul. 15, 2014

(54) METHOD OF FABRICATING A GALLIUM NITRIDE MERGED P-I-N SCHOTTKY (MPS) DIODE

(75) Inventors: Andrew P. Edwards, San Jose, CA (US); Hui Nie, Cupertino, CA (US); Isik C. Kizilyalli, San Francisco, CA (US); Linda Romano, Sunnyvale, CA (US); David P. Bour, Cupertino, CA (US); Richard J. Brown, Los Gatos, CA (US); Thomas R. Prunty, Santa Clara, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

(21) Appl. No.: 13/270,625

(22) Filed: Oct. 11, 2011

(65) Prior Publication Data

US 2013/0087878 A1    Apr. 11, 2013

(51) Int. Cl.
*H01L 21/28* (2006.01)
(52) U.S. Cl.
USPC .................... 438/572; 438/519; 257/E21.042
(58) Field of Classification Search
CPC .............. H01L 21/041; H01L 21/0415; H01L 21/0435
USPC .......... 438/341, 518, 519, 572; 257/E21.041, 257/E21.042, E21.045, E21.047, E21.064, 257/E21.351, E21.368
See application file for complete search history.

(56) References Cited

U.S. PATENT DOCUMENTS

| | | | |
|---|---|---|---|
| 2005/0167697 A1 | 8/2005 | Flynn et al. | |
| 2006/0046331 A1 | 3/2006 | Kiyama et al. | |
| 2006/0289891 A1* | 12/2006 | Hutchins | 257/103 |
| 2007/0096239 A1* | 5/2007 | Cao et al. | 257/458 |
| 2007/0215885 A1 | 9/2007 | Miyoshi et al. | |
| 2008/0121993 A1 | 5/2008 | Hefner et al. | |
| 2008/0203517 A1 | 8/2008 | Rueb et al. | |
| 2009/0166677 A1 | 7/2009 | Shibata et al. | |
| 2011/0057199 A1 | 3/2011 | Pan et al. | |
| 2011/0101369 A1* | 5/2011 | Zhu | 257/76 |
| 2011/0215338 A1 | 9/2011 | Zhang | |

OTHER PUBLICATIONS

Notification of Transmittal of the International Search Report and the Written Opinion of the International Searching Authority, or the Declaration and International Search Report and Written Opinion of the International Searching Authority for International Application No. PCT/US2012/059245 mailed on Dec. 11, 2012, 13 pages.

* cited by examiner

*Primary Examiner* — Cheung Lee
(74) *Attorney, Agent, or Firm* — Kilpatrick Townsend & Stockton LLP

(57) ABSTRACT

A semiconductor structure includes a III-nitride substrate with a first side and a second side opposing the first side. The III-nitride substrate is characterized by a first conductivity type and a first dopant concentration. The semiconductor structure also includes a III-nitride epitaxial structure including a first III-nitride epitaxial layer coupled to the first side of the III-nitride substrate and a plurality of III-nitride regions of a second conductivity type. The plurality of III-nitride regions have at least one III-nitride epitaxial region of the first conductivity type between each of the plurality of III-nitride regions. The semiconductor structure further includes a first metallic structure electrically coupled to one or more of the plurality of III-nitride regions and the at least one III-nitride epitaxial region. A Schottky contact is created between the first metallic structure and the at least one III-nitride epitaxial region.

15 Claims, 17 Drawing Sheets

METHOD OF FABRICATING A GALLIUM NITRIDE MERGED P-I-N SCHOTTKY (MPS) DIODE

CROSS-REFERENCES TO RELATED APPLICATIONS

The following regular U.S. patent applications (including this one) are being filed concurrently, and the entire disclosure of the other applications are incorporated by reference into this application for all purposes:

Application Ser. No. 13/270,606, filed Oct. 11, 2011, entitled "METHOD AND SYSTEM FOR FLOATING GUARD RINGS IN GAN MATERIALS";

Application Ser. No. 13/270,625, filed Oct. 11, 2011, entitled "METHOD FOR FABRICATING A GAN MERGED PIN, SCHOTTKY (MPS) DIODE"; and Application Ser. No. 13/270,641, filed Oct. 11, 2011, entitled "SCHOTTKY DIODE WITH BURIED LAYER IN GAN MATERIALS".

BACKGROUND OF THE INVENTION

Power electronics are widely used in a variety of applications. Power electronic devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to forming merged P-i-N Schottky (MPS) diodes using III-nitride semiconductor materials. Merely by way of example, the invention has been applied to methods and systems for manufacturing MPS diodes using gallium-nitride (GaN) based epitaxial layers. These MPS diodes can be used in a range of applications that can benefit from a high-voltage switch with low capacitance and very low leakage current in the off state.

According to an embodiment of the present invention, a method for fabricating a merged P-i-N Schottky (MPS) diode in gallium nitride (GaN) based materials is provided. The method includes providing a n-type GaN-based substrate with a first surface and a second surface and forming an n-type GaN-based epitaxial layer coupled to the first surface of the n-type GaN-based substrate. The method also includes forming a GaN structure having plurality of p-type GaN-based regions with at least one n-type GaN-based epitaxial region disposed between each of the plurality of p-type GaN-based regions. The method further includes forming a first metallic structure electrically coupled to one or more of the plurality of p-type GaN-based regions and the at least one n-type GaN-based epitaxial region. A Schottky contact is created between the first metallic structure and the at least one n-type GaN-based epitaxial region.

According to an embodiment of the present invention, a method for fabricating an epitaxial structure is provided. The method includes providing a III-nitride substrate of a first conductivity type with a first surface and a second surface, and forming a first III-nitride epitaxial layer of the first conductivity type coupled to the first surface of the III-nitride substrate. The method also includes forming a plurality of III-nitride regions of a second conductivity type with at least one III-nitride epitaxial structure of the first conductivity type between each of the plurality of III-nitride regions. The method further includes forming a first metallic structure electrically coupled to one or more of the plurality of III-nitride regions and the at least one III-nitride epitaxial structure. A Schottky contact is created between the first metallic structure and the at least one III-nitride epitaxial structure.

According to a specific embodiment of the present invention, a semiconductor structure is provided. The semiconductor structure includes a III-nitride substrate with a first side and a second side opposing the first side. The III-nitride substrate is characterized by a first conductivity type and a first dopant concentration. The semiconductor structure also includes a III-nitride epitaxial structure including a first III-nitride epitaxial layer coupled to the first side of the III-nitride substrate and a plurality of III-nitride regions of a second conductivity type. The plurality of III-nitride regions have at least one III-nitride epitaxial region of the first conductivity type between each of the plurality of III-nitride regions. The semiconductor structure further includes a first metallic structure electrically coupled to one or more of the plurality of III-nitride regions and the at least one III-nitride epitaxial region. A Schottky contact is created between the first metallic structure and the at least one III-nitride epitaxial region.

Numerous benefits are achieved by way of the present invention over conventional techniques. For example, embodiments of the present invention enable the use of thicker III-nitride semiconductor layers in comparison with conventional techniques, which can result in devices capable of operating at higher voltages than conventional devices. Additionally, the MPS diode has superior switching characteristics compared to conventional devices, such as high switching speed, low on-state resistance, and low off-state leakage current. These and other embodiments of the invention, along with many of its advantages and features, are described in more detail in conjunction with the text below and attached figures.

Figure 1:
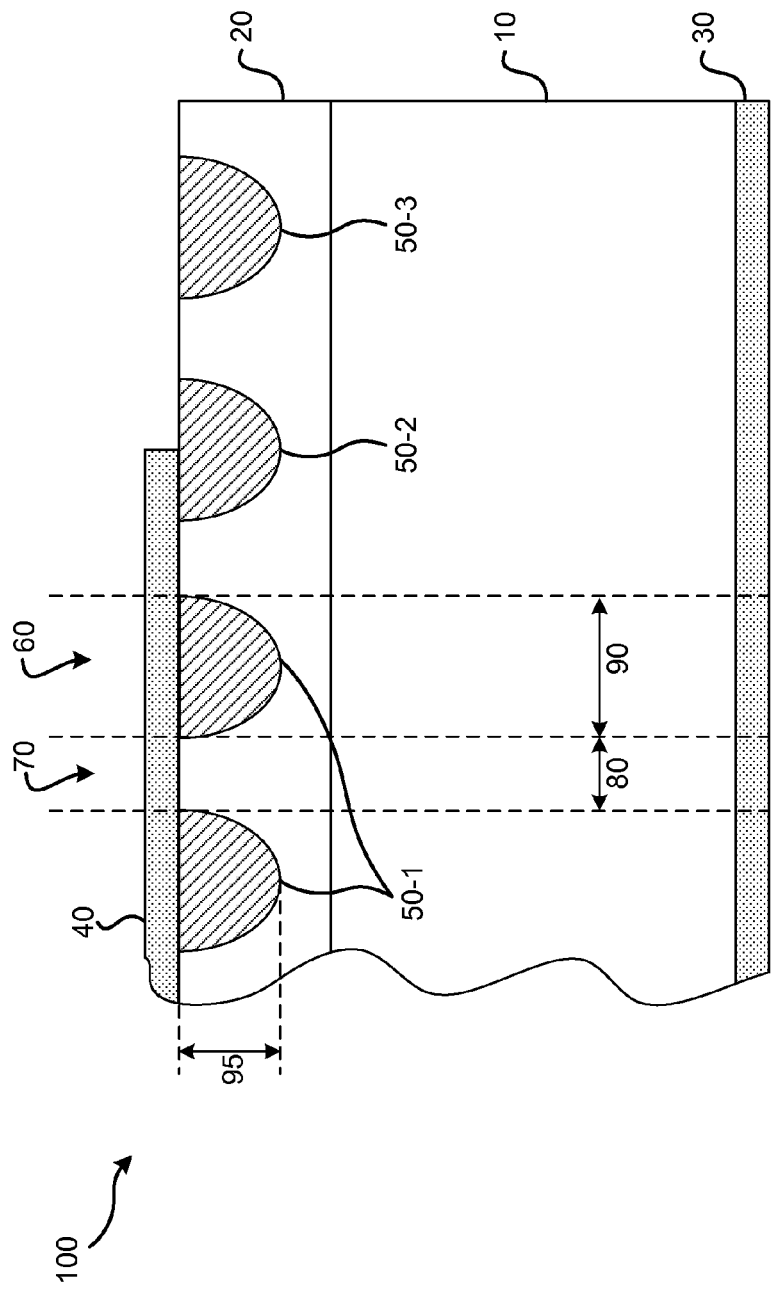
FIG. 1 is simplified cross-sectional diagram of a portion of a merged P-i-N Schottky (MPS) diode, according to an embodiment of the present invention.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF SPECIFIC EMBODIMENTS

Embodiments of the present invention relate to electronic devices. More specifically, the present invention relates to forming merged P-i-N Schottky (MPS) diodes using III-nitride semiconductor materials. Merely by way of example, the invention has been applied to methods and systems for manufacturing MPS diodes using gallium-nitride (GaN) based epitaxial layers. These MPS diodes can be used in a range of applications that can benefit from a high-voltage switch with low capacitance and very low leakage current in the off state.

GaN-based electronic and optoelectronic devices are undergoing rapid development, and are expected to outperform competitors in silicon (Si) and silicon carbide (SiC). Desirable properties associated with GaN and related alloys and heterostructures include high bandgap energy for visible and ultraviolet light emission, favorable transport properties (e.g., high electron mobility and saturation velocity), a high breakdown field, and high thermal conductivity. In particular, electron mobility, μ, is higher than competing materials for a given background doping level, N. This provides low resistivity, ρ, because resistivity is inversely proportional to electron mobility, as provided by equation (1):

$$\rho = \frac{1}{q\mu N}, \quad (1)$$

where q is the elementary charge.

Another superior property provided by GaN materials, including homoepitaxial GaN layers on bulk GaN substrates, is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by equation (2):

$$R = \frac{\rho L}{A}, \quad (2)$$

where A is the cross-sectional area of the channel or current path.

Homoepitaxial GaN layers on bulk GaN substrates also have relatively low defect density compared to materials grown on mismatched substrates, such as GaN grown on silicon, silicon carbide (SiC), or sapphire. Homoepitaxial GaN layers on bulk GaN substrates therefore have large minority carrier lifetime in intrinsic and/or low-doped regions of semiconductor devices that use these materials, enhancing the carrier injection effect for wider base regions. The low defect density also gives rise to superior thermal conductivity.

As described herein, MPS diodes created using homoepitaxial GaN layers not only are able to take advantage of the outstanding physical qualities of these materials, but also benefit from the structural advantages provided by combining P-i-N and Schottky diodes. An MPS diode is a device structure that can be designed to exhibit the low turn-on voltage of a Schottky diode in the forward direction, and the low reverse leakage current of a P-i-N diode in the reverse direction. An MPS diode can include a Schottky contact with one or more embedded p-n junctions (or P-i-N regions) within the area of the contact. The forward turn-on voltage is dominated by the Schottky portion before the p-n junctions turn on at a higher voltage. The reverse mode of operation is dominated by appropriately spaced p-n junctions. Furthermore, in some embodiments, the same processing used to form the p-n junctions embedded within the area of the Schottky contact also can be used to form edge termination structures to provide edge termination for the MPS diode.

According to embodiments of the present invention, gallium nitride (GaN) epitaxy on pseudo-bulk GaN substrates is utilized to fabricate MPS diodes and/or edge termination structures not possible using conventional techniques. For example, conventional methods of growing GaN include using a foreign substrate such as SiC. This can limit the thickness of a usable GaN layer grown on the foreign substrate due to differences in thermal expansion coefficients and lattice constant between the GaN layer and the foreign substrate. High defect densities at the interface between GaN and the foreign substrate further complicate attempts to create edge termination structures for various types of semiconductor devices.

FIG. 1 is a simplified cross-sectional diagram of a portion of an MPS diode 100, according to one embodiment, illustrating the basic physical features of the device. For instance, the MPS diode 100 can include a III-nitride epitaxial layer 20 coupled to a III-nitride substrate 10. Embedded within the III-nitride epitaxial layer 20 are regions 50 having an opposite conductivity type from the III-nitride epitaxial layer 20, such that the regions 50 have a p-type conductivity if the III-nitride epitaxial layer 20 has an n-type conductivity, and vice versa. A first metallic structure 40 is coupled to at least some of the regions 50 and a portion of the III-nitride epitaxial layer 20 between the regions 50. A second metallic structure 30 can be coupled to a side of the III-nitride substrate 10 opposing the III-nitride epitaxial layer 20.

The functionality of the MPS diode 100 is derived from having one or more Schottky regions 70 and P-i-N regions 60, formed from the features of the MPS diode 100 described above. For example, the III-nitride epitaxial layer 20 can have a relatively low dopant concentration, enabling it to form a drift layer for the Schottky regions 70 as well as the intrinsic (e.g., "i") component of the P-i-N regions 60. The P-i-N regions 60 include the regions 50, which have a relatively high dopant concentration. Depending on desired functionality, these regions form the P or N components of the P-i-N regions 60. The first metallic structure 40 forms a Schottky barrier with the relatively low-doped III-nitride epitaxial layer 20 for the Schottky regions, and an ohmic metal contact with the relatively high-doped regions 50 for the P-i-N regions 60. The III-nitride substrate 10 has a relatively high dopant concentration, allowing the III-nitride substrate 10 to form a P or N component of the P-i-N regions 60 (with opposite conductivity type as the component formed by the regions 50), as well as enabling the second metallic structure 30 to form an ohmic contact to the MPS diode 100.

The characteristics of the Schottky regions 70 and the P-i-N regions 60 can vary, depending on application. Some embodiments, for example, can include a single Schottky region 70 with one or more P-i-N regions 60. Other embodiments can include multiple Schottky regions 70 and multiple P-i-N regions 60. Additionally, the width 80 of the Schottky regions 70 and the width 90 of the P-i-N regions 60 can vary, depending on desired functionality for the MPS diode and the physical characteristics of the MPS diode's material components. These widths 80 and 90 also can vary within a single MPS diode 100. According to some embodiments, the width 80 of the Schottky regions 70 can vary between 0.5 µm to 10 µm. Furthermore, according to some embodiments, the width 90 of the PIN regions 60 can vary between 0.2 µm to 10 µm. The depth 95 of regions 50 also can vary, depending on the application. According to some embodiments, the depth 95 can vary between 0.2 µm to 3 µm. One of ordinary skill in the art would recognize how these widths 80 and 90 can be modified to provide the desired functionality.

Region 50-2 at the lateral edge of the second metallic structure 40 can form junction termination extensions, and region 50-3 beyond the lateral edge of the second metallic structure 40 can form edge termination structures, which can be used individually or collectively to help eliminate the effects of field crowding on the MPS diode. Moreover, multiple edge termination regions can be used for a single MPS diode. The size and spacing of these regions 50-2 and 50-3, as well as the voltage at which they are biased during operation, can impact their effectiveness, and may vary by application. Moreover the spacing can vary as a function of distance from the MPS diode, where the spacing typically increases with increased distance. According to one embodiment, the width of edge termination regions, ranging from 0.5 µm to 5 µm, can be approximately the same, while the distance between edge termination regions increases with increased distance from the MPS diode, ranging anywhere from 0.5 µm to 6 µm. A more detailed discussion regarding edge termination structure formation and operation in III-nitride materials is found in application Ser. No. 13/270,606, incorporated by reference above.

Figure 2:
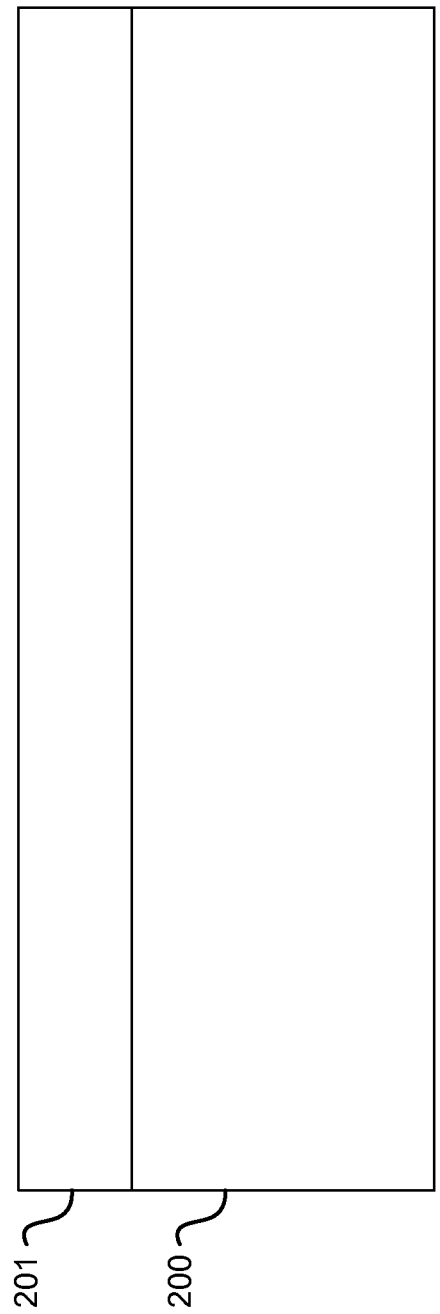
FIGS. 2-5 are simplified cross-sectional diagrams illustrating the fabrication of an MPS diode by implanting dopants in an epitaxial layer according to an embodiment of the present invention.

FIGS. 2-5 illustrate a first process for creating an MPS diode in GaN with edge termination structures formed through implantation of an epitaxial layer. Referring to FIG. 2, a first GaN epitaxial layer 201 is formed on a GaN substrate 200 having the same conductivity type. The GaN substrate 200 can be a pseudo-bulk GaN material on which the first GaN epitaxial layer 201 is grown. Dopant concentrations (e.g., doping density) of the GaN substrate 200 can vary, depending on desired functionality. For example, a GaN substrate 200 can have an n+ conductivity type, with dopant concentrations ranging from $1\times10^{17}$ cm$^{-3}$ to $1\times10^{19}$ cm$^{-3}$. Although the GaN substrate 200 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

The properties of the first GaN epitaxial layer 201 can also vary, depending on desired functionality. The first GaN epitaxial layer 201 can serve as a drift layer for the Schottky region(s) of the MPS diode and an intrinsic component for the P-i-N junction(s) of the MPS diode. Thus, the first GaN epitaxial layer 201 can be a relatively low-doped material. For example, the first GaN epitaxial layer 201 can have an n− conductivity type, with dopant concentrations ranging from $1\times10^{14}$ cm$^{-3}$ to $1\times10^{18}$ cm$^{-3}$. Furthermore, the dopant concentration can be uniform, or can vary, for example, as a function of the thickness of the drift region.

The thickness of the first GaN epitaxial layer 201 can also vary substantially, depending on the desired functionality. As discussed above, homoepitaxial growth can enable the first GaN epitaxial layer 201 to be grown far thicker than layers formed using conventional methods. In general, in some embodiments, thicknesses can vary between 0.5 µm and 100 µm, for example. In other embodiments thicknesses are greater than 5 µm. Resulting breakdown voltages for the MPS diode 100 can vary depending on the embodiment. Some embodiments provide for breakdown voltages of at least 100V, 300V, 600V, 1.2 kV, 1.7 kV, 3.3 kV, 5.5 kV, 13 kV, or 20 kV.

Different dopants can be used to create n- and p-type GaN epitaxial layers and structures disclosed herein. For example, n-type dopants can include silicon, oxygen, or the like. P-type dopants can include magnesium, beryllium, zinc, or the like.

Figure 3:
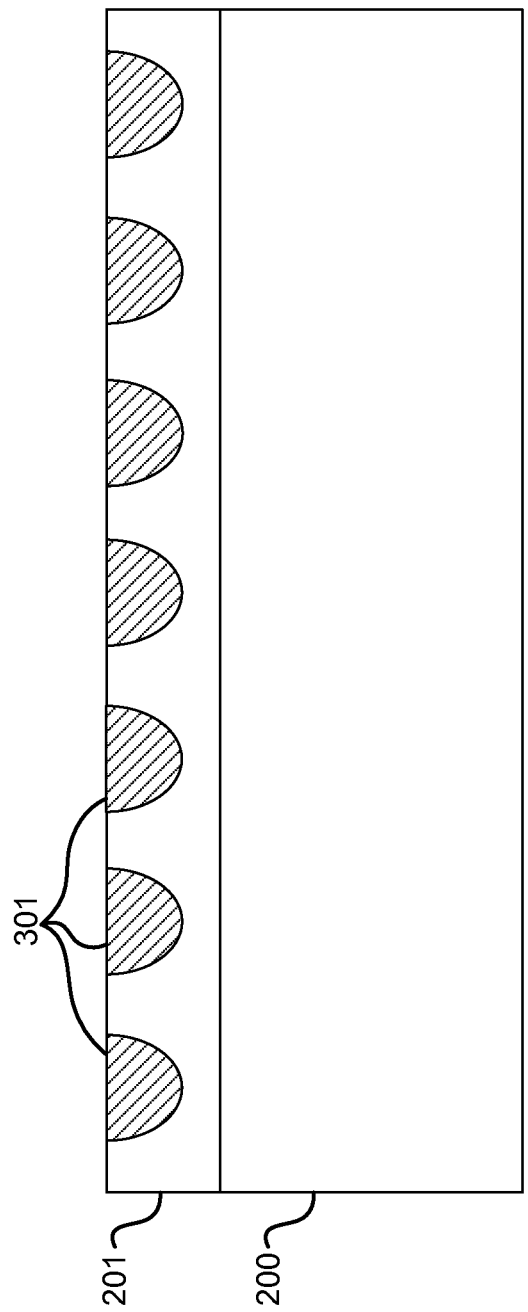

FIG. 3 illustrates the formation of regions 301 embedded in the first GaN epitaxial layer 201. These regions 301 have a different conductivity type than the first GaN epitaxial layer 201, thereby forming the P-i-N structures of the MPS diode 100. In one embodiment, for example, the regions 301 have a p+ conductivity type and the first GaN epitaxial layer 201 has an n− conductivity type. The dopant concentration of the regions can be relatively high, for example in a range from about $5\times10^{17}$ cm$^{-3}$ to about $1\times10^{19}$ cm$^{-3}$. Additionally, the dopant concentration of the regions 301 can be uniform or non-uniform as a function of thickness.

The regions in this embodiment can be formed by implantation, which can be carried out using any of a variety of implantation techniques for GaN materials. Certain implantation techniques, for example, are provided in application Ser. No. 13/240,877, entitled "METHOD AND SYSTEM FOR DIFFUSION AND IMPLANTATION IN GALLIUM NITRIDE BASED DEVICES," the disclosure of which is hereby incorporated by reference in its entirety.

Figure 4:
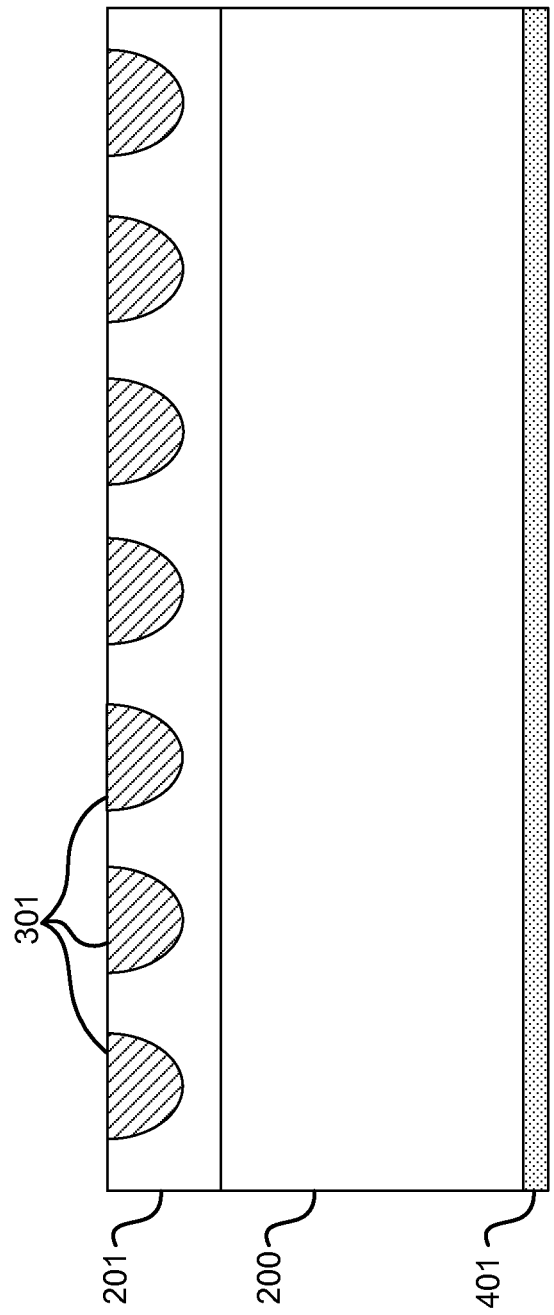

FIG. 4 illustrates the formation of a back metal structure 401 below the GaN substrate 200. The back metal structure 401 can be one or more layers of ohmic metal that serve as a contact for the cathode of the MPS diode. For example, the back metal structure 401 can comprise a titanium-aluminum (Ti/Al) ohmic metal. Other metals and/or alloys can be used including, but not limited to, aluminum, nickel, gold, combinations thereof, or the like. In some embodiments, an outermost metal of the back metal structure 401 can include gold, tantalum, tungsten, palladium, silver, or aluminum, combinations thereof, and the like. The back metal structure 401 can be formed using any of a variety of methods such as sputtering, evaporation, or the like.

Figure 5:
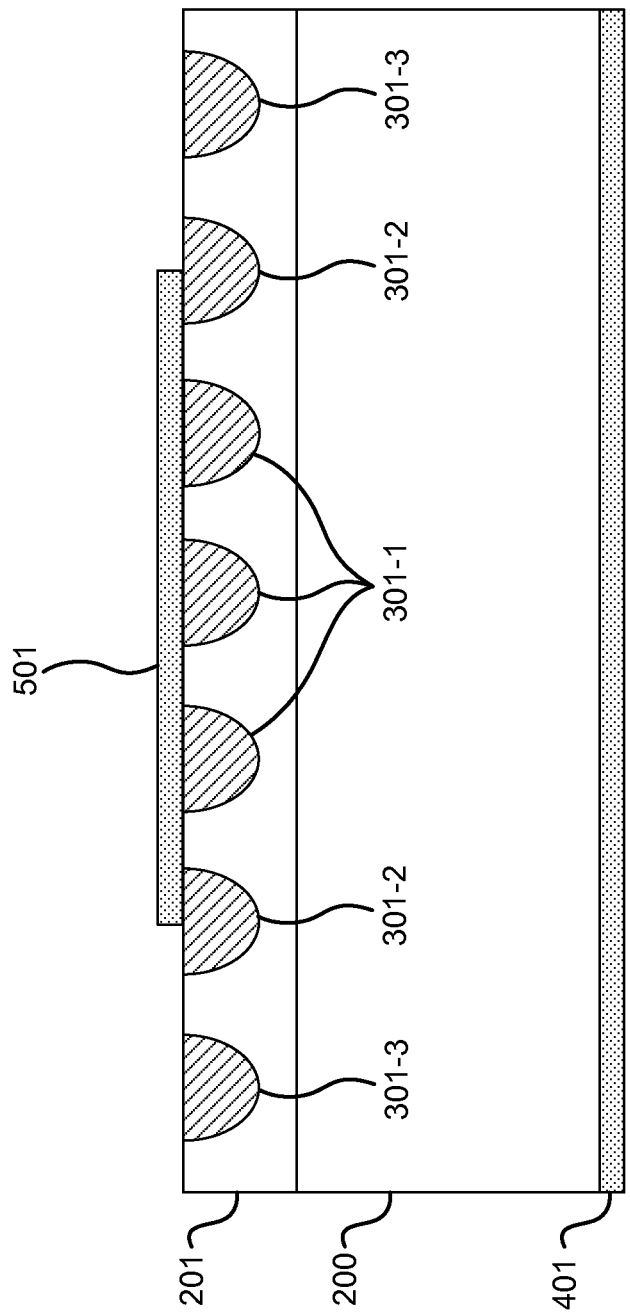

FIG. 5 illustrates the formation of a contact metal structure 501 on some of the regions 301, including the regions 301-1 and a portion of regions 301-2, as well as portions of the first GaN epitaxial layer 201 between these regions. The contact metal structure 501 can be one or more layers of metal and/or alloys to create a Schottky barrier with the first GaN epitaxial layer 201, which have a relatively low dopant concentration. On the other hand, the contact metal structure 501 can form an ohmic contact with the regions 301-1, which have a relatively high dopant concentration, forming the P-i-N portions of the MPS diode. Remaining regions 301-2 and 301-3 can provide junction extension and/or edge termination for the MPS diode. The contact metal structure 501 can be formed using a variety of techniques, including lift-off and/or deposition with subsequent etching, which can vary depending on the metals used. In some embodiments, the contact metal structure 501 can include nickel, platinum, palladium, silver, gold, and the like.

Although some embodiments provided herein (e.g., the embodiment illustrated in FIGS. 2-5) are discussed in terms of GaN substrates and GaN epitaxial layers, the present invention is not limited to these particular binary III-V materials and is applicable to a broader class of III-V materials, in particular III-nitride materials. Additionally, although a GaN substrate is illustrated in some implementations, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention.

FIGS. 6-9, illustrate a process for creating a MPS diode in GaN with edge termination structures formed through the etching of an epitaxial layer. The process can begin with the same steps of providing a GaN substrate 200 and a first GaN epitaxial layer 201, as shown in FIG. 2. The structure properties, such as dopant concentrations and thicknesses, can vary from those in embodiments shown in FIGS. 2-5 or be similar, depending on desired functionality.

Figure 6:
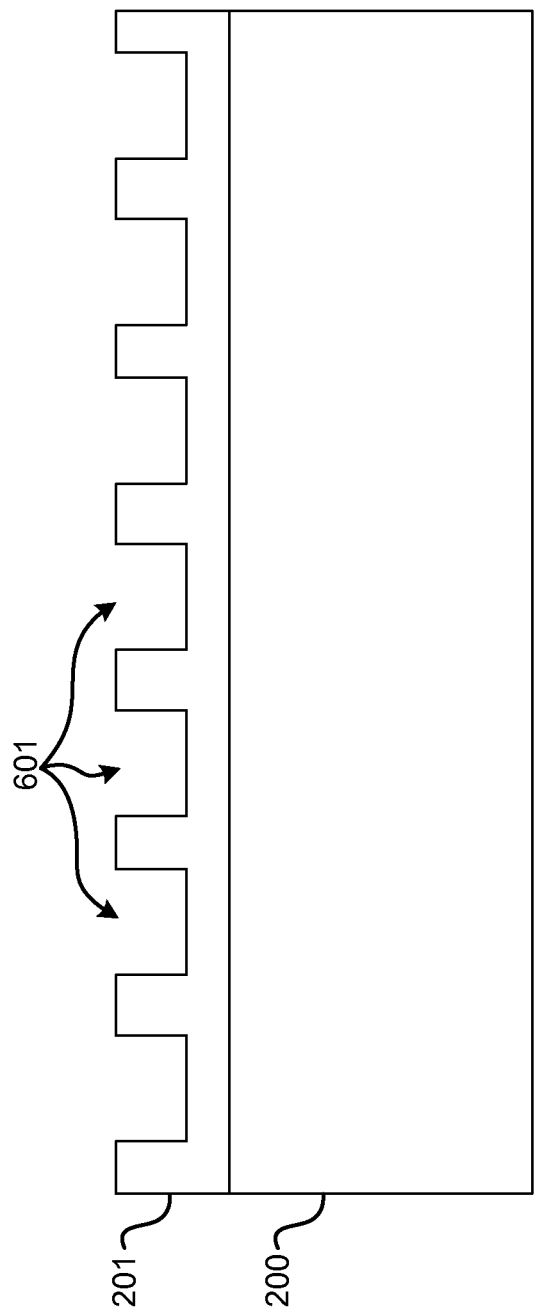
FIGS. 6-9 are simplified cross-sectional diagrams illustrating the fabrication of an MPS diode by forming epitaxial structures in an epitaxial layer according to an embodiment of the present invention.

FIG. 6 illustrates the removal of portions of the first GaN epitaxial layer 201 to form openings 601 in the first GaN epitaxial layer 201. As illustrated, the remaining portions of the first GaN epitaxial layer 201 form regions between the openings 601 and the GaN substrate 200, as well as between each of the openings 601 themselves. This allows the remaining portion of the first GaN epitaxial layer 201 to form respective drift and intrinsic regions for the Schottky and P-i-N junctions of the MPS diode. The removal of the first GaN epitaxial layer 201 can be performed by a controlled etch using an etch mask (not shown but having the dimensions of the openings 601). Epitaxial structures forming part of the P-i-N junctions and edge termination structures for the MPS diode are formed in the openings 601, so the removal of the first GaN epitaxial layer 201 can be designed to stop approximately at a desired depth in the first GaN epitaxial layer 201 for these P-i-N junctions and edge termination structures. Moreover, the removal process may involve multiple etching steps resulting in different depths for different components of the MPS diode 100. Inductively-coupled plasma (ICP) etching and/or other common GaN etching processes can be used.

Figure 7:
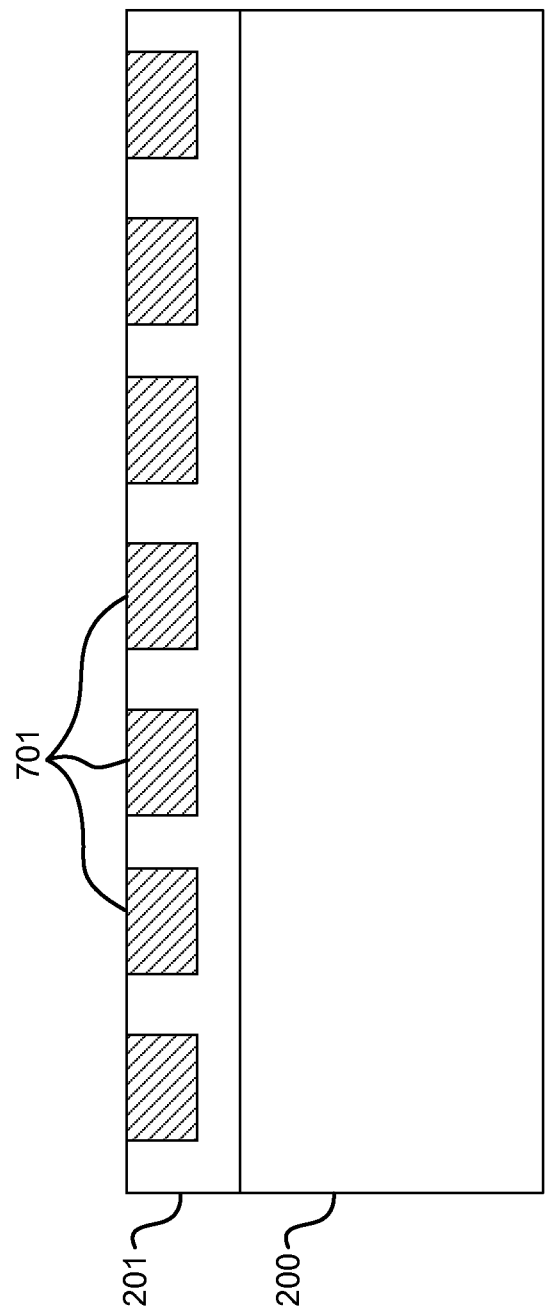

FIG. 7 illustrates the formation of epitaxial regions 701, or structures, in the openings 601 the first GaN epitaxial layer 201. These epitaxial regions 701, can have a conductivity type different than the first GaN epitaxial layer 201. For instance, if the first GaN epitaxial layer 201 is formed from an n-type GaN material, the epitaxial regions 701 will be formed from a p-type GaN material, and vice versa, thereby creating P-i-N and edge termination structures of the MPS diode 100. In some embodiments, the epitaxial regions 701 are formed using a continuous regrowth over portions of the first GaN epitaxial layer 201 with other portions of the structure, such as regions between the epitaxial regions 701, characterized by reduced or no growth as a result of the presence of a regrowth mask (not shown). One of ordinary skill in the art would recognize many variations, modifications, and alternatives.

The thickness of the epitaxial regions 701 can vary, depending on the process used to form the layer and the device design. In some embodiments, the thickness of the epitaxial regions 701 is between 0.1 µm and 5 µm. In other embodiments, the thickness of the epitaxial regions 701 is between 0.3 µm and 1 µm.

The epitaxial regions 701 can be highly doped, for example in a range from about $5 \times 10^{17}$ cm$^{-3}$ to about $1 \times 10^{19}$ cm$^{-3}$. Additionally, as with other epitaxial layers, the dopant concentration of the epitaxial regions 701 can be uniform or non-uniform as a function of thickness, depending on desired functionality. In some embodiments, for example, the dopant concentration increases with thickness, such that the dopant concentration is relatively low near the GaN substrate 200 and increases as the distance from the GaN substrate 200 increases. Such embodiments provide higher dopant concentrations at the top of the epitaxial regions 701 where a metal contact can be subsequently formed. Other embodiments utilize heavily doped contact layers (not shown) to form ohmic contacts.

One method of forming the epitaxial regions 701, and other layers described herein, can be through a regrowth process that uses an in-situ etch and diffusion preparation processes. These preparation processes are described more fully in U.S. patent application Ser. No. 13/198,666, filed on Aug. 4, 2011, the disclosure of which is hereby incorporated by reference in its entirety.

Figure 8:
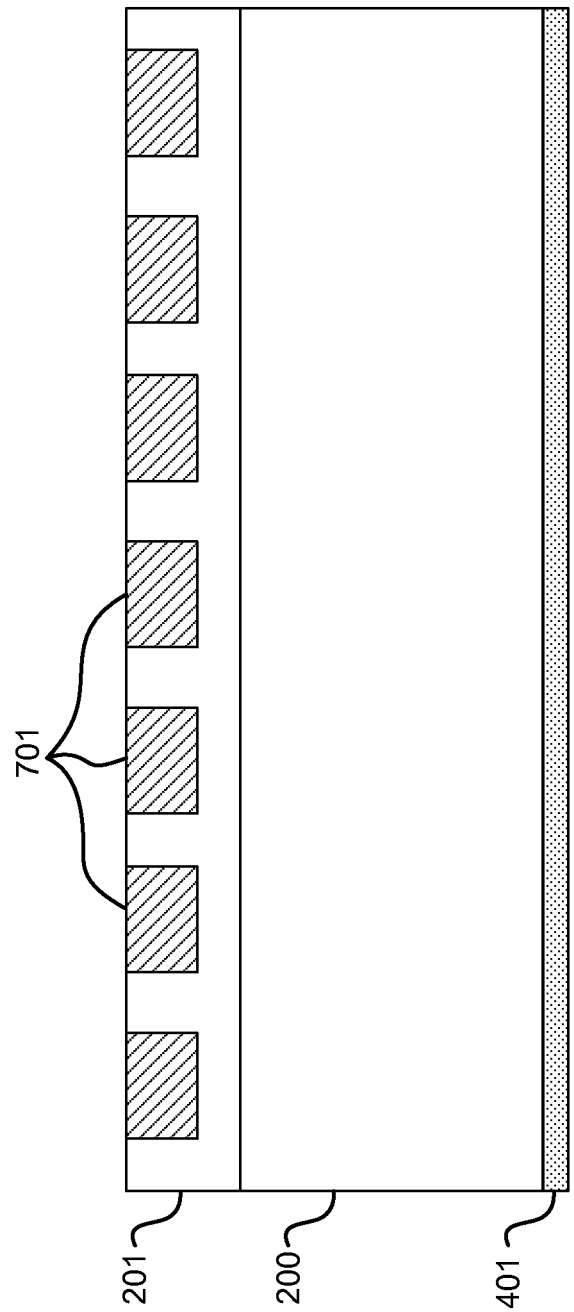

FIG. 8 illustrates the formation of a back metal structure 401 below the GaN substrate 200. As with the previous embodiment shown in FIGS. 2-5, back metal structure 401 can be one or more layers of ohmic metal that serve as a contact for the cathode of the MPS diode. For example, the back metal structure 401 can comprise a titanium-aluminum (Ti/Al) ohmic metal. Other metals and/or alloys can be used including, but not limited to, aluminum, nickel, gold, combinations thereof, or the like. In some embodiments, an outermost metal of the back metal structure 401 can include gold, tantalum, tungsten, palladium, silver, or aluminum, combinations thereof, and the like. The back metal structure 401 can be formed using any of a variety of methods such as sputtering, evaporation, or the like.

Figure 9:
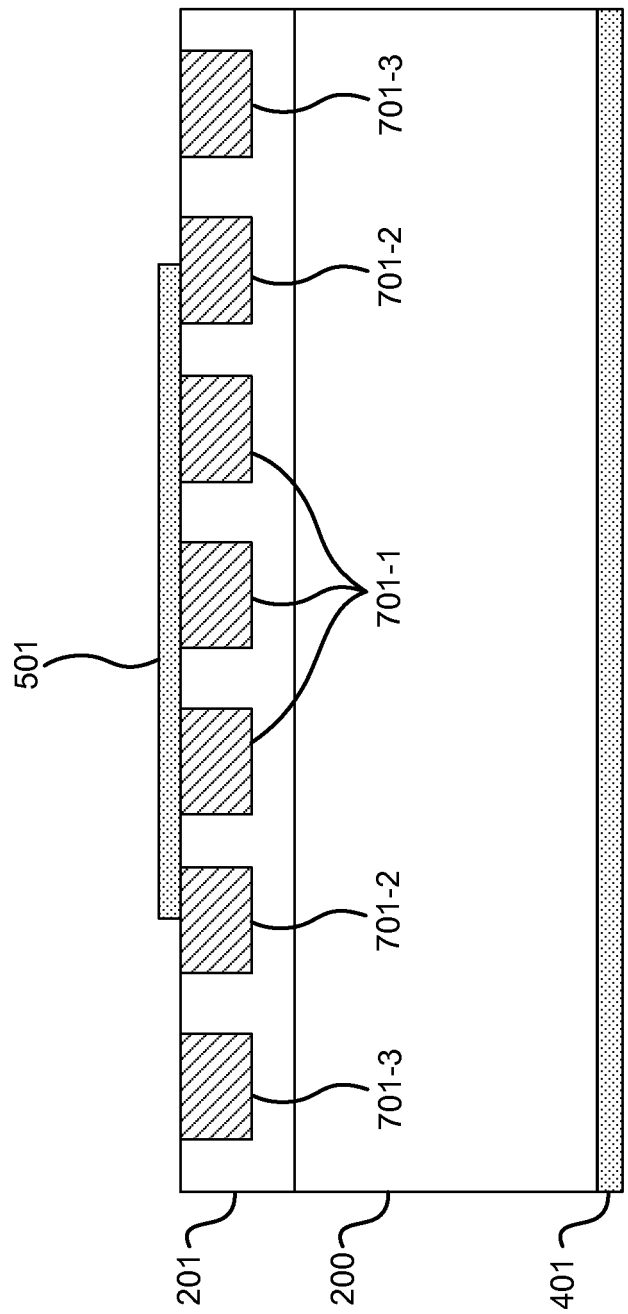

FIG. 9 illustrates the formation of a contact metal structure 501 on some of the epitaxial regions 701, including the epitaxial regions 701-1 and a portion of epitaxial regions 701-2. The contact metal structure 501 is also coupled with portions of the first GaN epitaxial layer 201 between these regions. Similar to the embodiment shown in FIG. 4, the contact metal structure 501 can be one or more layers of metal and/or alloys to create a Schottky barrier with the first GaN epitaxial layer 201, which have a relatively low dopant concentration. On the other hand, the contact metal structure 501 can form an ohmic contact with the regions 701-1, which have a relatively high dopant concentration, forming the P-i-N portions of the MPS diode. Remaining regions 701-2 and 701-3 can provide junction extension and/or edge termination for the MPS diode. The contact metal structure 501 can be formed using materials and manufacturing techniques similar to that of the contact metal structure 501 in the embodiment of FIG. 4.

FIGS. 10-14, illustrate a process for creating a MPS diode in GaN with edge termination structures formed through the formation and etching of an additional epitaxial layer. The process can begin with the same steps of providing a GaN substrate 200 and a first GaN epitaxial layer 201, as shown in FIG. 2. The structure properties, such as dopant concentrations and thicknesses, can vary from those in embodiments shown in FIGS. 2-5 and FIGS. 6-9, or be similar depending on desired functionality.

Figure 10:
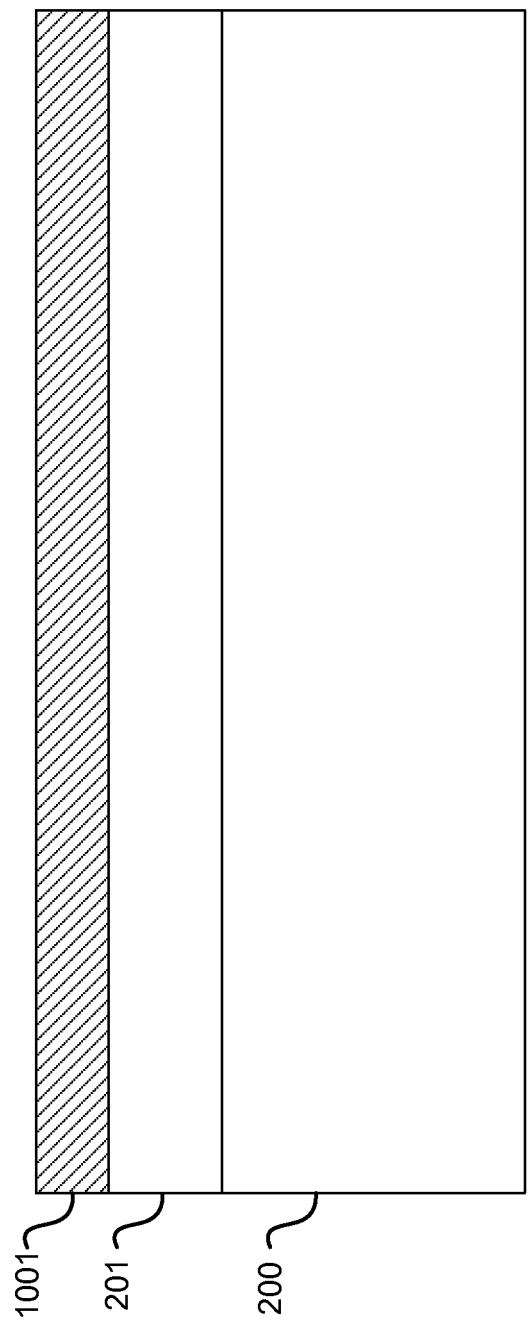
FIGS. 10-14 are simplified cross-sectional diagrams illustrating the fabrication of an MPS diode by forming epitaxial structures on an epitaxial layer according to an embodiment of the present invention.

FIG. 10 illustrates the formation of a second GaN epitaxial layer 1001 coupled to the first GaN epitaxial layer 201. The second GaN epitaxial layer 1001 can have an conductivity type opposite than the conductivity of the first GaN epitaxial layer 201. For instance, if the first GaN epitaxial layer 201 is formed from an n-type GaN material, the epitaxial regions 701 will be formed from a p-type GaN material, and vice versa. In some embodiments, the second GaN epitaxial layer 701 is formed using an epitaxial growth or regrowth that subsequently can be used to form the P-i-N and edge termination structures of the MPS diode. One of ordinary skill in the art would recognize many variations, modifications, and alternatives.

The thickness of the second GaN epitaxial layer 1001 can vary, depending on the process used to form the layer and the device design. In some embodiments, the thickness of the second GaN epitaxial layer 1001 is between 0.1 μm and 5 μm. In other embodiments, the thickness of the second GaN epitaxial layer 1001 is between 0.1 μm and 1 μm.

The second GaN epitaxial layer 1001 can be highly doped, for example in a range from about $5\times10^{17}$ cm$^{-3}$ to about $1\times10^{19}$ cm$^{-3}$. Additionally, as with other epitaxial layers, the dopant concentration of the second GaN epitaxial layer 1001 can be uniform or non-uniform as a function of thickness, depending on desired functionality.

Figure 11:
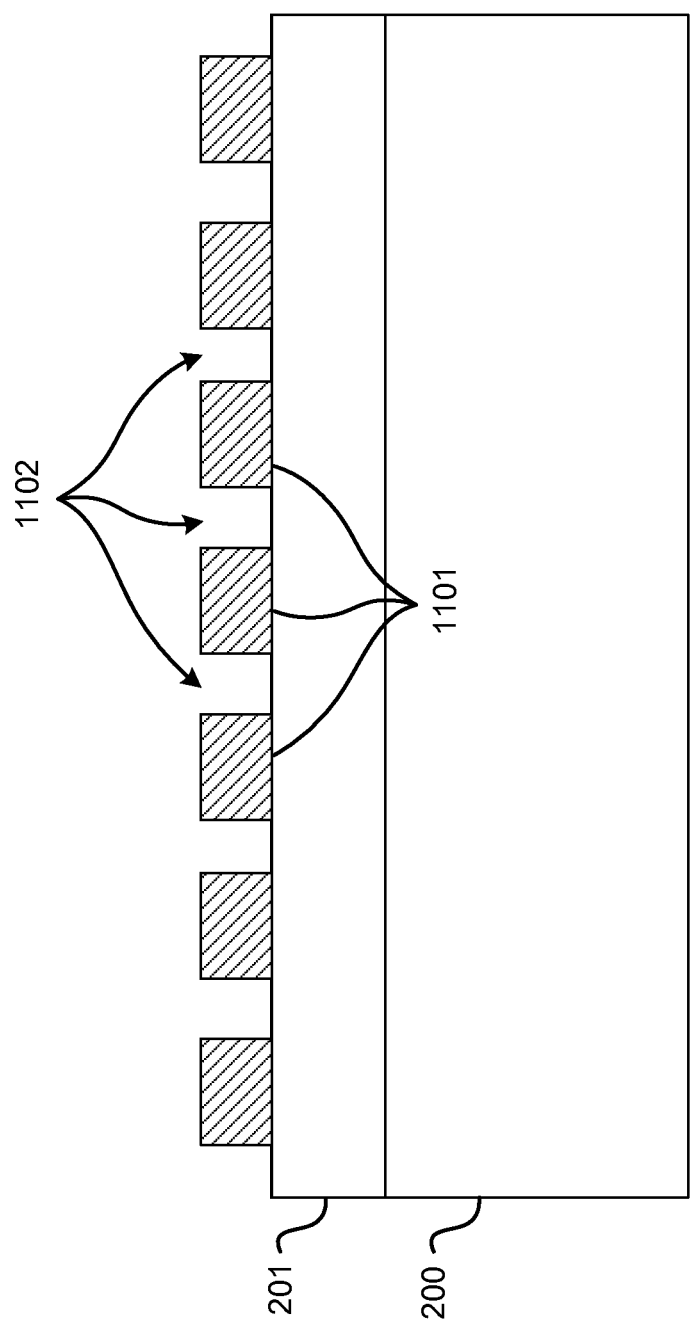

FIG. 11 illustrates the removal at least a portion of the second GaN epitaxial layer 1001 (illustrated in FIG. 10) to form GaN epitaxial regions 1101, or structures. These GaN epitaxial regions 1101 eventually will be used to form P-i-N, junction extension, and/or edge termination structures, and are therefore sized and spaced accordingly, with predetermined spaces 1102 between each of the GaN epitaxial regions 1101. The removal can be performed by a controlled etch using an etch mask (not shown but having the dimensions of the GaN epitaxial regions 1101) designed to stop at approximately the interface between the second GaN epitaxial layer 1001 and the first GaN epitaxial layer 201. ICP etching and/or other common GaN etching processes can be used. In the illustrated embodiment, the material removal process used to remove portions of the second GaN epitaxial layer 1001 terminates at the interface of the second GaN epitaxial layer 1001 and the first GaN epitaxial layer 201. However, in other embodiments, the process can terminate at a different depth, for example, extending into or leaving a portion of the first GaN epitaxial layer 201.

Figure 12:
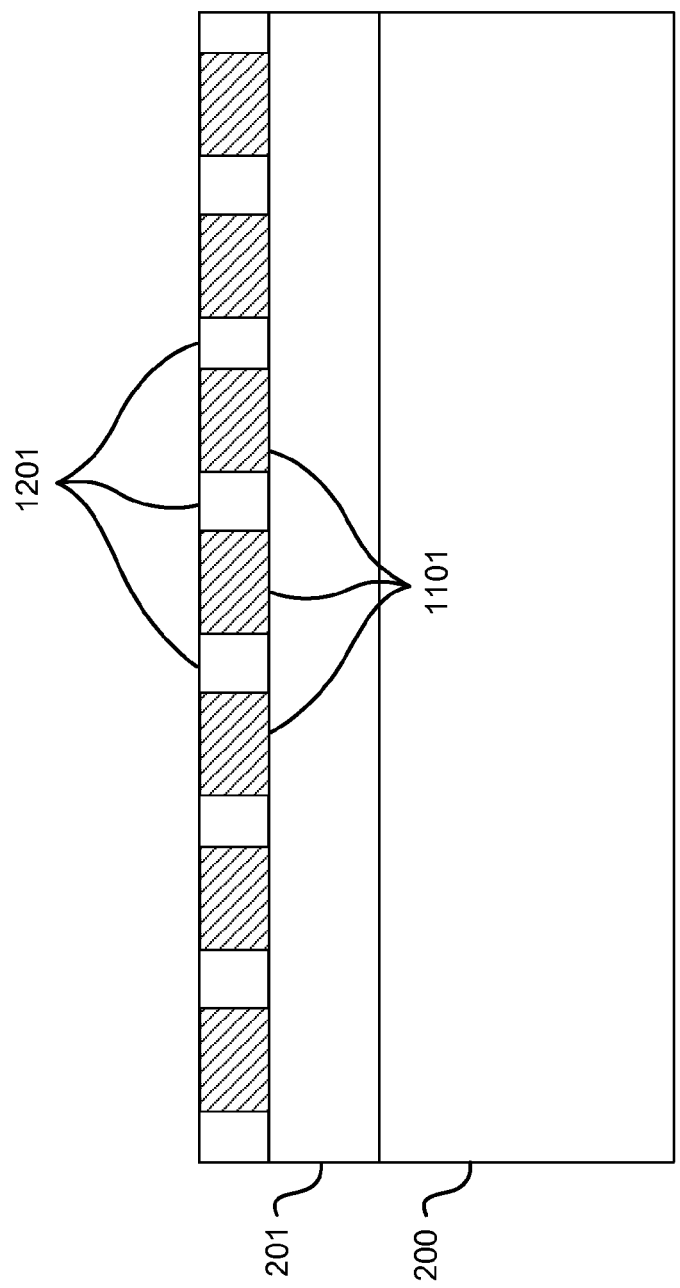

FIG. 12 illustrates the formation of GaN epitaxial structures 1201 in the predetermined spaces 1102 between the GaN epitaxial regions 1101. These GaN epitaxial structures 1201 can have the same conductivity type as the first GaN epitaxial layer 201, with approximately the same dopant concentration as the first GaN epitaxial layer 201 as well. For example, in an embodiment where the GaN epitaxial regions 1101 comprise a p+ conductivity type, both the first GaN epitaxial layer 201 and the GaN epitaxial structures 1201 can have an n− conductivity type. Just as the GaN epitaxial regions 1101 are used to form P-i-N regions of the MPS diode, the GaN epitaxial structures 1201 are provided to form the Schottky contacts of the MPS diode. In some embodiments, the GaN epitaxial structures 1201 are formed using a continuous regrowth over portions of the first GaN epitaxial layer 201 with other portions of the structure, such as the GaN epitaxial regions 1101, characterized by reduced or no growth as a result of the presence of a regrowth mask (not shown).

Various alterations to the illustrated embodiment can be made. For example, some embodiments can have a single GaN epitaxial structure 1201 used to create a Schottky contact for the MPS diode, while other embodiment can include two or more. Additionally or alternatively, although the illustrated embodiment shows the GaN epitaxial structures 1201 having approximately the same height as the GaN epitaxial regions 1101, the height of the GaN epitaxial structures 1201 can be greater or less than the GaN epitaxial regions 1101, depending on various factors, such as manufacturing capabilities, desired functionality, and other concerns. One of ordinary skill in the art would recognize many variations, modifications, and alternatives.

Figure 13:
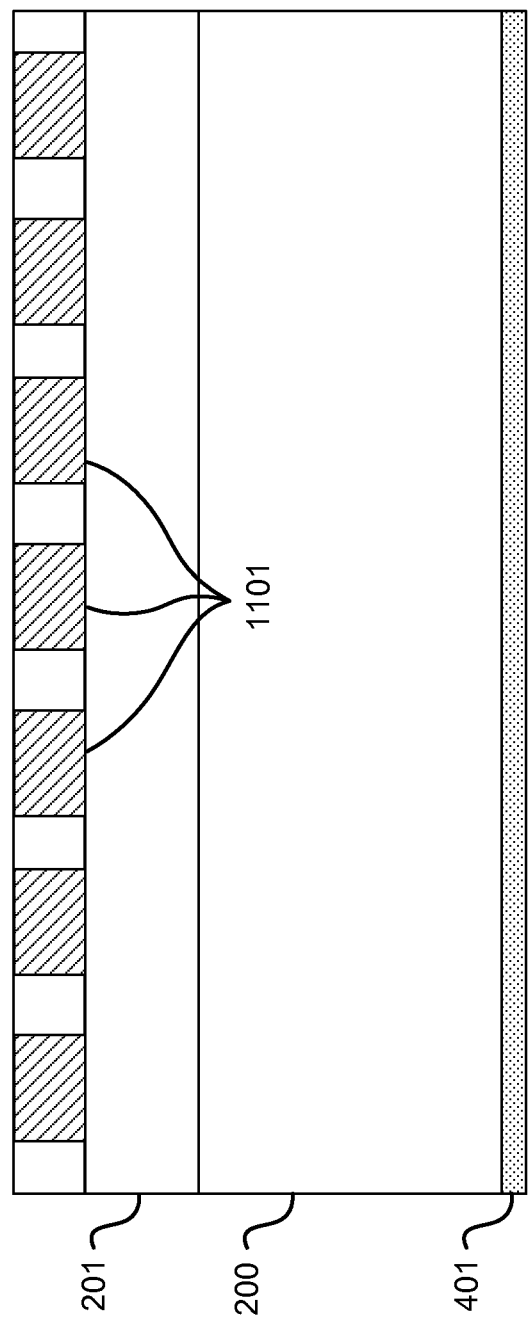

FIG. 13 illustrates the formation of a back metal structure 401 below the GaN substrate 200. As with the other embodiments disclosed herein, the back metal structure 401 can be one or more layers of ohmic metal that serve as a contact for the cathode of the MPS diode. The composition of the back metal structure 401, as well as its size and method of manufacture, can be similar to the embodiments described above.

Figure 14:
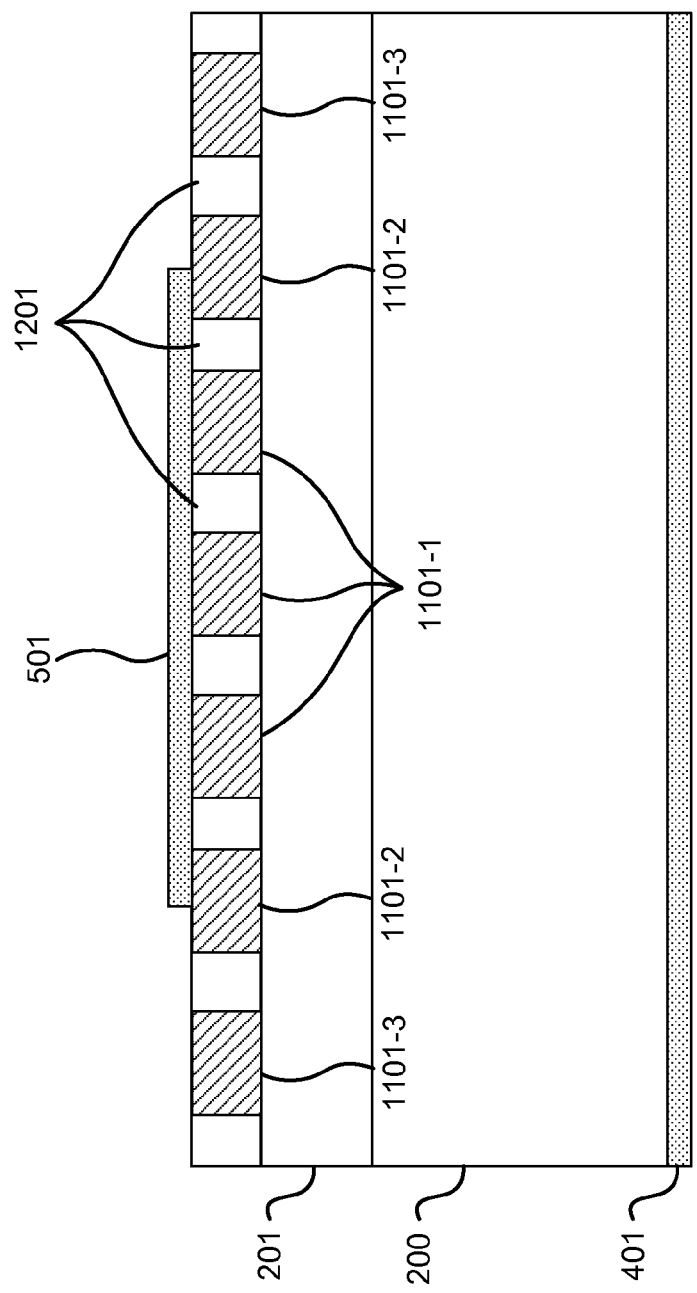

FIG. 14 illustrates the formation of a contact metal structure 501 on some of the GaN epitaxial regions 1101, including the GaN epitaxial regions 1101-1 and a portion of epitaxial GaN epitaxial regions 1101-2. The contact metal structure 501 is also coupled with at least one of the GaN epitaxial structures 1201. Similar to the embodiments disclosed earlier, the contact metal structure 501 can be one or more layers of metal and/or alloys to create a Schottky barrier with the first GaN epitaxial layer 201 and an ohmic contact with the GaN epitaxial regions 1101-1. Remaining GaN epitaxial regions 1101-2 and 1101-3 can provide junction extension and/or edge termination for the MPS diode. The contact metal structure 501 can be similar to the second metallic structures 501 provided in previous embodiments, with similar composition and method of manufacture.

Examples provided in conjunction with the description of fabrications processes illustrated in FIGS. 2-5, 6-9, and 10-14 utilize a process flow in which an n-type drift layer is grown using an n-type substrate. However, the present invention is not limited to this particular configuration. In other embodiments, substrates with p-type doping are utilized. Additionally, embodiments can use materials having an opposite conductivity type to provide devices with different functionality. Thus, although some examples relate to the growth of n-type GaN epitaxial layer(s) doped with silicon, in other embodiments the techniques described herein are applicable to the growth of highly or lightly doped material, p-type material, material doped with dopants in addition to or other than silicon such as Mg, Ca, Be, Ge, Se, S, O, Te, and the like. The substrates discussed herein can include a single material system or multiple material systems including composite structures of multiple layers. One of ordinary skill in the art would recognize many variations, modifications, and alternatives.

Figure 15:
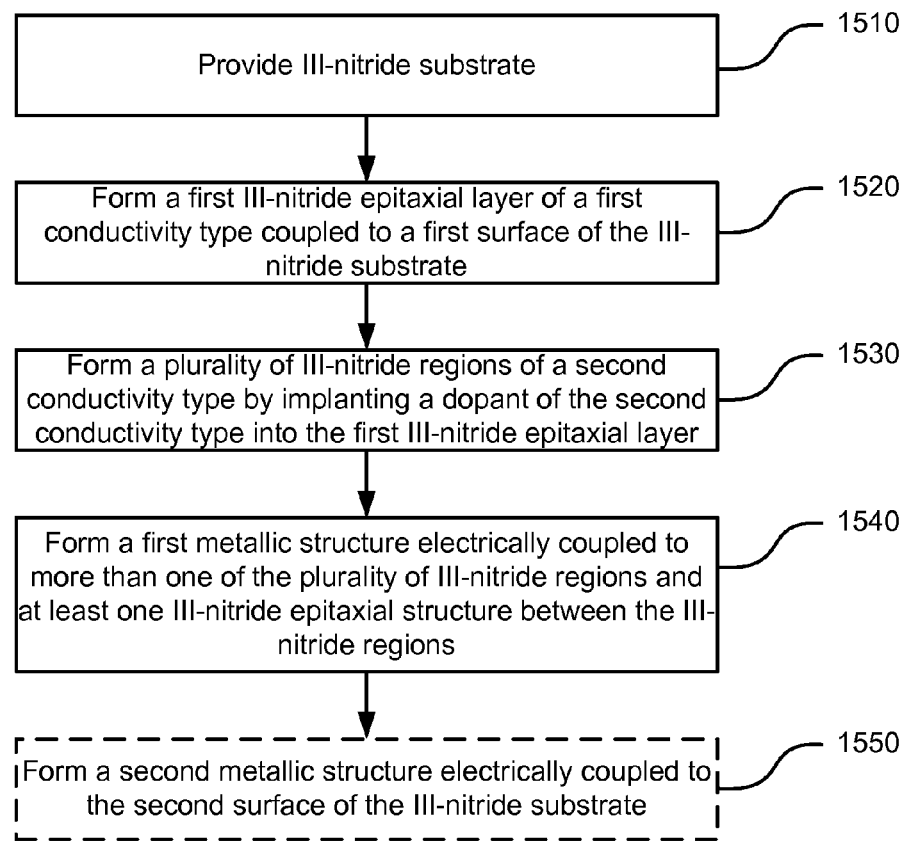
FIG. 15 is a simplified flowchart illustrating a method of fabricating an MPS diode by implanting dopants in an epitaxial layer according to an embodiment of the present invention.

FIG. 15 is a simplified flowchart illustrating a method of fabricating an MPS diode with edge termination structures in a III-nitride material, according to an embodiment of the present invention. Referring to FIG. 15, a III-nitride substrate is provided (1510), characterized by a first conductivity type and a first dopant concentration. In an embodiment, the III-nitride is a GaN substrate with n+ conductivity type. The method also includes forming a first III-nitride epitaxial layer (e.g., an n-type GaN epitaxial layer) coupled to a first surface of the III-nitride substrate (1520). The III-nitride substrate and first III-nitride epitaxial layer are characterized by a first conductivity type, for example n-type conductivity, and the first III-nitride epitaxial layer is characterized by a second dopant concentration less than the first dopant concentration. Using the homoepitaxy techniques described herein, the thickness of the first III-nitride epitaxial layer can be thicker than available using conventional techniques, for example, between about 3 μm and about 100 μm.

The method further includes forming a plurality of III-nitride regions of a second conductivity type (e.g., a GaN epitaxial layer of a p+ conductivity type) by implanting a dopant of the second conductivity type into the first III-nitride epitaxial layer (1530). At least one III-nitride epitaxial structure of the first conductivity type (e.g., a portion of the first III-nitride epitaxial layer of the first conductivity type) can be disposed between each of the plurality of III-nitride regions. As discussed herein, the plurality of III-nitride regions of the second conductivity type subsequently form P-i-N regions and edge termination structures of the MPS diode. Accordingly, the number III-nitride regions can vary, depending on a desired number of P-i-N regions and edge termination structures in the resulting device. According to some embodiments, the number of edge termination can vary from one to seven or more. The edge termination structures can be shaped any of a variety of ways, according to the physical characteristics of the MPS diode and other considerations. Embodiments of MPS diodes also can have two or more P-i-N regions.

Continuing with the method of FIG. 15, a first metallic structure is formed, electrically coupled to more than one of the plurality of III-nitride regions and the at least one III-nitride epitaxial structure between the III-nitride regions (1540). The first metallic structure further can be deposited and patterned to overlap the first (i.e., closest) edge termination structures. The various epitaxial layers used to form the MPS diode and edge termination structures do not have to be uniform in dopant concentration as a function of thickness, but may utilize varying doping profiles as appropriate to the particular application. Optionally, a second metallic structure is formed, electrically coupled to the second surface of the III-nitride substrate (1550), providing a cathode for the MPS diode.

It should be appreciated that the specific steps illustrated in FIG. 15 provide a particular method of fabricating a MPS diode with edge termination structures according to an embodiment of the present invention. Other sequences of steps may also be performed according to alternative embodiments. For example, alternative embodiments of the present invention may perform the steps outlined above in a different order. Moreover, the individual steps illustrated in FIG. 15 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 16:
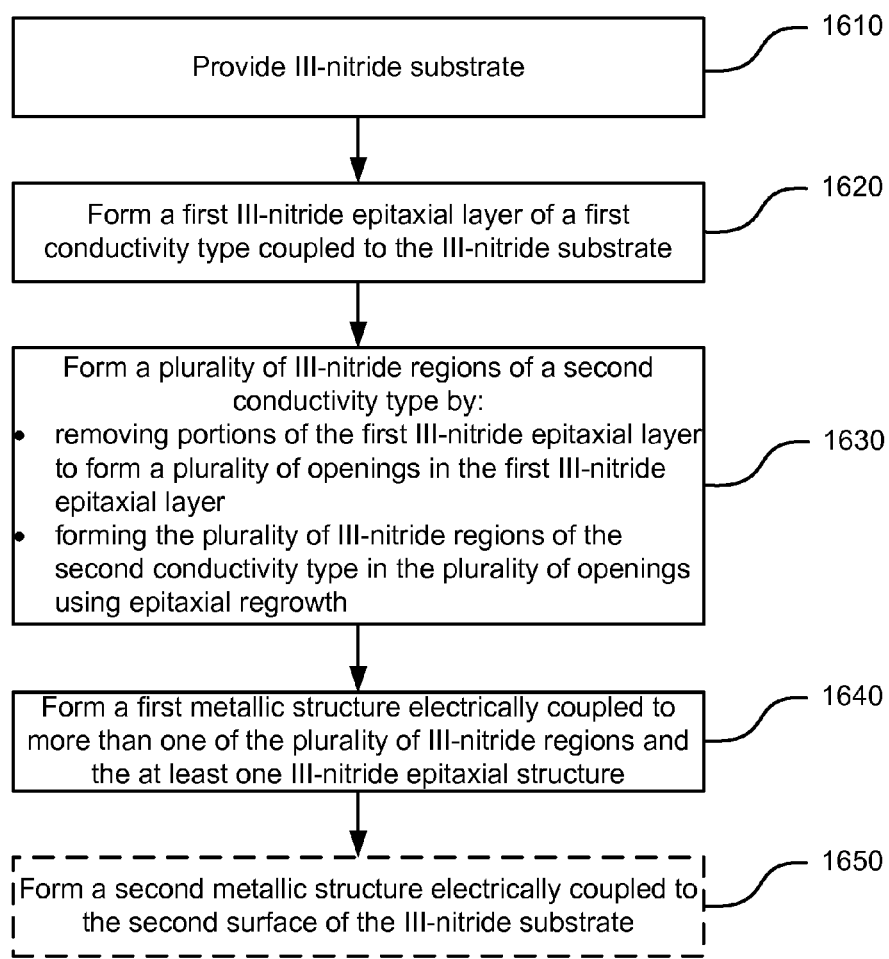
FIG. 16 is a simplified flowchart illustrating a method of fabricating an MPS diode by forming epitaxial structures in an epitaxial layer according to an embodiment of the present invention.

FIG. 16 is a simplified flowchart illustrating a method of fabricating a MPS diode with edge termination structures in a III-nitride material, according to another embodiment of the present invention. Similar to the method illustrated in FIG. 15, a III-nitride substrate is provided (1610), having a first conductivity type and a first dopant concentration. The method also includes forming a first III-nitride epitaxial layer (e.g., an n-type GaN epitaxial layer) coupled to the III-nitride substrate (1620). Here, the first III-nitride epitaxial layer can be an intrinsic or very lightly doped layer to function as the intrinsic region of the P-i-N diode.

The method further includes forming a plurality of III-nitride regions of a second conductivity type by removing portions of the first III-nitride epitaxial layer to form a plurality of openings in the first III-nitride epitaxial layer; and forming the plurality of III-nitride regions of the second conductivity type in the plurality of openings using epitaxial regrowth (1630). As stated above, removal can be performed by etching the first III-nitride epitaxial layer. Depending on the conductivity types of the first III-nitride epitaxial layer and plurality of III-nitride regions, the plurality of III-nitride regions form the P or N components of the P-i-N regions in the MPS diode.

Continuing with the method of FIG. 16, a first metallic structure is formed, electrically coupled to more than one of the plurality of III-nitride regions and the at least one III-nitride epitaxial structure (e.g., portion of the first III-nitride epitaxial layer) between the III-nitride regions (1640). As with other embodiments provided herein, the first metallic structure further can be deposited and patterned to overlap the closest edge termination structures. Optionally, a second metallic structure can be formed, electrically coupled to the second surface of the III-nitride substrate (1650), providing a cathode for the MPS diode.

It should be appreciated that the specific steps illustrated in FIG. 16 provide a particular method of fabricating a MPS diode with edge termination structures according to an embodiment of the present invention. Other sequences of steps may also be performed according to alternative embodiments. For example, alternative embodiments of the present invention may perform the steps outlined above in a different order. Moreover, the individual steps illustrated in FIG. 16 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 17:
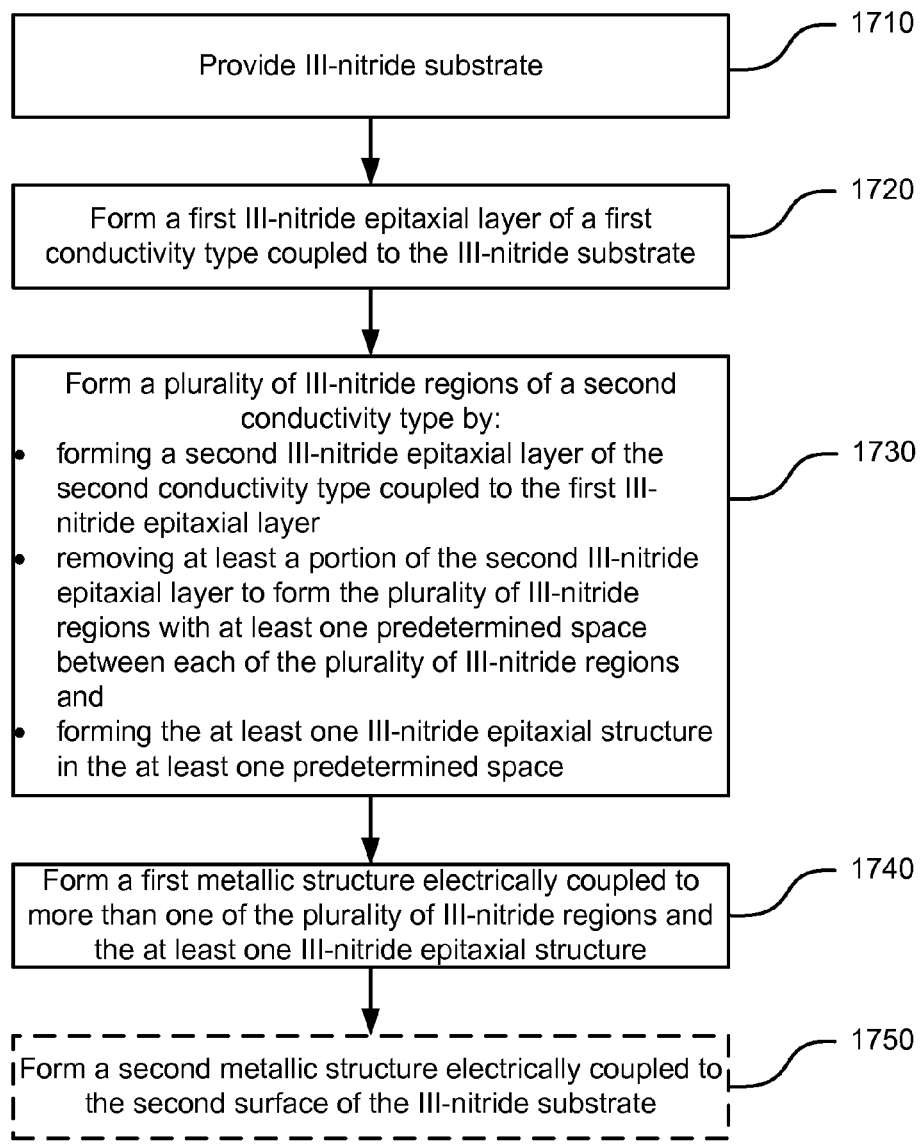
FIG. 17 is a simplified flowchart illustrating a method of fabricating an MPS diode by forming epitaxial structures on an epitaxial layer according to an embodiment of the present invention.

FIG. 17 is a simplified flowchart illustrating a method of fabricating a P-i-N diode with edge termination structures in a III-nitride material, according to yet another embodiment of the present invention. Similar to the method illustrated in FIGS. 15 and 16, a III-nitride substrate is provided (1710), having a first conductivity type and a first dopant concentration. The method also includes forming a first III-nitride epitaxial layer (e.g., an n-type GaN epitaxial layer) coupled to the III-nitride substrate (1720).

The method further includes forming a plurality of III-nitride regions of a second conductivity type by forming a second III-nitride epitaxial layer of the second conductivity type coupled to the first III-nitride epitaxial layer, removing at least a portion of the second III-nitride epitaxial layer to form the plurality of III-nitride regions with at least one predetermined space between each of the plurality of III-nitride regions, and forming the at least one III-nitride epitaxial structure in the at least one predetermined space (1730). Unlike the methods provided in FIGS. 15 and 16, the method of FIG. 17 forms both the plurality of III-nitride regions, and the at least one III-nitride epitaxial structure (disposed between the III-nitride regions) above the first III-nitride epitaxial layer, which can be preferable in light of certain manufacturing and other considerations.

Similar to the embodiments disclosed above, a first metallic structure also is formed, electrically coupled to more than one of the plurality of III-nitride regions and the at least one III-nitride epitaxial structure between the III-nitride regions (1740). As with other embodiments provided herein, the first metallic structure further can be deposited and patterned to overlap the closest edge termination structures. Optionally, a second metallic structure is formed, electrically coupled to the second surface of the III-nitride substrate (1750), providing a cathode for the MPS diode.

It should be appreciated that the specific steps illustrated in FIG. 17 provide a particular method of fabricating a MPS diode with edge termination structures according to an embodiment of the present invention. Other sequences of steps may also be performed according to alternative embodiments. For example, alternative embodiments of the present invention may perform the steps outlined above in a different order. Moreover, the individual steps illustrated in FIG. 17 may include multiple sub-steps that may be performed in various sequences as appropriate to the individual step. Furthermore, additional steps may be added or removed depending on the particular applications. One of ordinary skill in the art would recognize many variations, modifications, and alternatives.

One of ordinary skill in the art would recognize many variations, modifications, and alternatives to the examples provided herein. As illustrated herein, edge termination structures can be provided in any of a variety of shapes and forms, depending on physical features of the semiconductor device for which the edge termination structures provide edge termination. For instance, in certain embodiments, edge termination structures may not circumscribe the semiconductor device. Additionally or alternatively, conductivity types of the examples provided herein can be reversed (e.g., replacing an n-type semiconductor material with a p-type material, and vice versa), depending on desired functionality. Other variations, alterations, modifications, and substitutions are contemplated.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A semiconductor structure comprising:
   a free-standing III-nitride wafer having a first side and a second side opposing the first side, wherein the free-standing III-nitride wafer is characterized by a first conductivity type and a first dopant concentration;
   a III-nitride epitaxial structure comprising:
      a first III-nitride epitaxial layer coupled directly to the first side of the free-standing III-nitride wafer, wherein the first III-nitride epitaxial layer is characterized by the first conductivity type and a second dopant concentration lower than the first dopant concentration; and
      a plurality of III-nitride regions of a second conductivity type, the plurality of III-nitride regions of the second conductivity type having at least one III-nitride epitaxial region of the first conductivity type disposed between adjacent ones of the plurality of III-nitride regions of the second conductivity type; and
   a first metallic structure electrically coupled to one or more of the plurality of III-nitride regions of the second conductivity type and the at least one III-nitride epitaxial region of the first conductivity type, wherein a Schottky contact is created between the first metallic structure and the at least one III-nitride epitaxial region of the first conductivity type.

2. The semiconductor structure of claim 1 further comprising a second metallic structure electrically coupled to the second side of the free-standing III-nitride wafer.

3. The semiconductor structure of claim 1 wherein:
   the plurality of III-nitride regions of the second conductivity type comprise a plurality of III-nitride epitaxial structures of the second conductivity type embedded in the first III-nitride epitaxial layer; and
   the at least one III-nitride epitaxial region of the first conductivity type comprises at least one portion of the first III-nitride epitaxial layer.

4. The semiconductor structure of claim 1 wherein:
   the plurality of III-nitride regions of the second conductivity type comprise a plurality of regions in the first III-nitride epitaxial layer doped with a dopant of the second conductivity type; and
   the at least one III-nitride epitaxial region of the first conductivity type comprises at least one portion of the first III-nitride epitaxial layer.

5. The semiconductor structure of claim 1 wherein:
   the plurality of III-nitride regions of the second conductivity type comprise a plurality of III-nitride epitaxial structures of the second conductivity type formed on the first III-nitride epitaxial layer; and
   the at least one III-nitride epitaxial region of the first conductivity type comprises at least one epitaxial structure of the first conductivity type formed on the first III-nitride epitaxial layer.

6. The semiconductor structure of claim 1 wherein at least one of the plurality of III-nitride regions of the second conductivity type is configured to provide edge termination to a semiconductor device.

7. The semiconductor structure of claim 1 wherein the first metallic structure is electrically coupled to a first portion of the plurality of III-nitride regions of the second conductivity type and is not electrically coupled to a second portion of the plurality of III-nitride regions of the second conductivity type, and each of the second portion of the plurality of III-nitride regions of the second conductivity type are separated from one another by a spacing that increases with distance from the first metallic structure.

8. A semiconductor structure comprising:
   a III-nitride substrate having a first side and a second side opposing the first side, wherein the III-nitride substrate is characterized by a first conductivity type;
   a III-nitride epitaxial structure comprising:
      a first III-nitride epitaxial layer coupled to the first side of the III-nitride substrate; and
      a plurality of III-nitride regions of a second conductivity type having at least one III-nitride epitaxial region of the first conductivity type disposed between adjacent ones of the plurality of III-nitride regions of the second conductivity type;
   a first metallic structure electrically coupled to a first portion of the plurality of III-nitride regions of the second conductivity type and the at least one III-nitride epitaxial region of the first conductivity type, wherein a Schottky contact is created between the first metallic structure and the at least one III-nitride epitaxial region of the first conductivity type, and wherein the first metallic structure is not electrically coupled to a second portion of the plurality of III-nitride regions of the second conductivity type, each of the second portion of the plurality of III-nitride regions of the second conductivity type being separated from one another by a spacing that increases with distance from the first metallic structure; and
   a second metallic structure electrically coupled to the second side of the III-nitride substrate.

9. The semiconductor structure of claim 8 wherein:
   the plurality of III-nitride regions of the second conductivity type comprise a plurality of III-nitride epitaxial structures of the second conductivity type embedded in the first III-nitride epitaxial layer; and
   the at least one III-nitride epitaxial region of the first conductivity type comprises at least one portion of the first III-nitride epitaxial layer.

10. The semiconductor structure of claim 8 wherein:
the plurality of III-nitride regions of the second conductivity type comprise a plurality of regions in the first III-nitride epitaxial layer doped with a dopant of the second conductivity type; and
the at least one III-nitride epitaxial region of the first conductivity type comprises at least one portion of the first III-nitride epitaxial layer.

11. The semiconductor structure of claim 8 wherein:
the plurality of III-nitride regions of the second conductivity type comprise a plurality of III-nitride epitaxial structures of the second conductivity type formed on the first III-nitride epitaxial layer; and
the at least one III-nitride epitaxial region of the first conductivity type comprises at least one epitaxial structure of the first conductivity type formed on the first III-nitride epitaxial layer.

12. The semiconductor structure of claim 8 wherein the second metallic structure comprises an ohmic contact to the second side of the III-nitride substrate.

13. The semiconductor structure of claim 8 wherein at least one of the plurality of III-nitride regions of the second conductivity type is configured to provide edge termination to a semiconductor device.

14. The semiconductor structure of claim 8 wherein the III-nitride substrate is characterized by the first conductivity type and a first dopant concentration, and the first III-nitride epitaxial layer is characterized by the first conductivity type and a second dopant concentration lower than the first dopant concentration.

15. The semiconductor structure of claim 8 wherein the first III-nitride epitaxial layer is directly coupled to the first side of the III-nitride substrate.

* * * * *